United States Patent
Jung et al.

(10) Patent No.: US 7,646,017 B2
(45) Date of Patent: Jan. 12, 2010

(54) THIN FILM TRANSISTOR ARRAY PANEL INCLUDING ASSISTANT LINES

(75) Inventors: Jin-Goo Jung, Seoul (KR); Kyung-Min Park, Seongnam-si (KR); Chun-Gi You, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 11/218,211

(22) Filed: Aug. 31, 2005

(65) Prior Publication Data

US 2006/0049407 A1    Mar. 9, 2006

(30) Foreign Application Priority Data

Sep. 3, 2004    (KR) .................... 10-2004-0070341

(51) Int. Cl.
*H01L 31/00* (2006.01)
(52) U.S. Cl. ............................. 257/59; 257/72
(58) Field of Classification Search .............. 257/59, 257/72
See application file for complete search history.

(56) References Cited

U.S. PATENT DOCUMENTS

| | | | | | |
|---|---|---|---|---|---|
| 5,475,246 | A | * | 12/1995 | Wei et al. | 257/291 |
| 2002/0158995 | A1 | * | 10/2002 | Hwang et al. | 349/43 |
| 2003/0094615 | A1 | * | 5/2003 | Yamazaki et al. | 257/72 |
| 2003/0209726 | A1 | * | 11/2003 | Shigeno | 257/200 |
| 2004/0007705 | A1 | * | 1/2004 | Song et al. | 257/72 |
| 2004/0008167 | A1 | * | 1/2004 | Shigeno | 345/76 |
| 2004/0099865 | A1 | * | 5/2004 | Tak et al. | 257/72 |
| 2004/0113149 | A1 | * | 6/2004 | Kim | 257/59 |
| 2005/0098785 | A1 | * | 5/2005 | You | 257/72 |

FOREIGN PATENT DOCUMENTS

| | | |
|---|---|---|
| JP | 2004-004680 | 1/2004 |
| JP | 2004-070308 | 3/2004 |
| KR | 100145897 | 5/1998 |
| KR | 1020030064975 | 6/2003 |

* cited by examiner

*Primary Examiner*—Kenneth A Parker
*Assistant Examiner*—Anthony Ho
(74) *Attorney, Agent, or Firm*—Innovation Counsel LLP (57) ABSTRACT

Improved thin film transistor array panels are provided. In one embodiment, a panel includes a plurality of gate lines, data lines, and a plurality of switching elements connected to the gate lines and the data lines. An interlayer insulating layer is formed between the gate lines and the data lines. A passivation layer covering the gate lines, the data lines, and the switching elements is also provided having a plurality of first contact holes exposing portions of the data lines, wherein the switching elements and the pixel electrodes are connected through the first contact holes. A plurality of contact assistants are formed on the passivation layer and are connected to the data lines through a plurality of second contact holes in the passivation layer. A plurality of auxiliary lines are connected to the data lines through a plurality of third contact holes in the interlayer insulating layer.

12 Claims, 7 Drawing Sheets

THIN FILM TRANSISTOR ARRAY PANEL INCLUDING ASSISTANT LINES

CROSS-REFERENCE TO RELATED APPLICATION

This application claims priority to corresponding Korean Patent Application No. 10-2004-0070341 filed in the Korean Intellectual Property Office, Republic of Korea, on Sep. 3, 2004, the entire contents of which is hereby incorporated by reference.

BACKGROUND OF THE INVENTION (a) Field of the Invention

The present invention relates to thin film transistor array panels.

(b) Description of Related Art

Flat panel displays such as liquid crystal displays (LCDs) and organic light emitting displays (OLEDs) typically include display panels having a plurality of pixels, a plurality of signal lines connected to the pixels, a plurality of drivers for driving the display panel, and a controller for controlling the drivers.

The drivers usually include a plurality of integrated circuit (IC) chips that are mounted on flexible printed circuit (FPC) films attached to the display panel or mounted directly on the display panel. The driver chips are supplied with control signals and driving voltages from a printed circuit board (PCB) having a plurality of circuit elements, including the controller and a voltage generator, mounted thereon.

When the driving chips are mounted directly on the display panel, the end portions of the signal lines extend to contact areas outside the display area where the signal lines are electrically and physically connected to output terminals. The contact areas include a plurality of conductive films and the end portions of the signal lines. The contact areas are provided between the display panel and the PCB for transmitting control signals, driving voltages, and image data.

Unfortunately, connections between the conductive films and driving chips at the contact areas are often inferior, resulting in corrosion of the conductive films by etchants used to disconnect the signal lines during the manufacture of display panels. Accordingly, there is a need for an improved approach to providing connections between signal lines and driving chips of display panels.

SUMMARY OF THE INVENTION

In accordance with an embodiment of the present invention, a thin film transistor array panel is provided which includes a plurality of gate lines and a plurality of data lines intersecting the gate lines. A plurality of switching elements are connected to the gate lines and the data lines, and a plurality of pixel electrodes are connected to the switching elements. An interlayer insulating layer is formed between the gate lines and the data lines. A passivation layer covering the gate lines, the data lines, and the switching elements is also provided having a plurality of first contact holes exposing portions of the data lines, wherein the switching elements and the pixel electrodes are connected through the first contact holes. A plurality of contact assistants are formed on the passivation layer and are connected to the data lines through a plurality of second contact holes in the passivation layer A plurality of auxiliary lines are connected to the data lines through a plurality of third contact holes in the interlayer insulating layer, wherein the third contact holes do not overlap the second contact holes and are completely covered by the passivation layer.

In another embodiment, a thin film transistor array panel is provided which includes a plurality of gate lines and a plurality of data lines intersecting the gate lines. A plurality of switching elements are connected to the gate lines and the data lines, and a plurality of pixel electrodes are connected to the switching elements. An interlayer insulating layer formed between the gate lines and the data lines. A passivation layer covering the gate lines, the data lines, and the switching elements is also provided having a plurality of first contact holes exposing portions of the data lines, wherein the switching elements and the pixel electrodes are connected through the first contact holes. A plurality of contact assistants are formed on the passivation layer and are connected to the data lines through a plurality of second contact holes in the passivation layer. A plurality of assistant lines are formed on the passivation layer, wherein the assistant lines overlap the data lines adjacent to the contact assistants.

In another embodiment, a thin film transistor array panel is provided which includes a plurality of data lines and a passivation layer covering the data lines. A plurality of contact assistants are formed on the passivation layer and are connected to the data lines through a plurality of contact holes in the passivation layer. A plurality of assistant lines are also formed on the passivation layer and overlap the data lines adjacent to the contact assistants.

These and other embodiments of the present invention will be more readily apparent from the detailed description set forth below taken in conjunction with the accompanying drawings

DETAILED DESCRIPTION OF EMBODIMENTS

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

Examples of display devices according to embodiments of the present invention will now be described with reference to the accompanying drawings.

Figure 1:
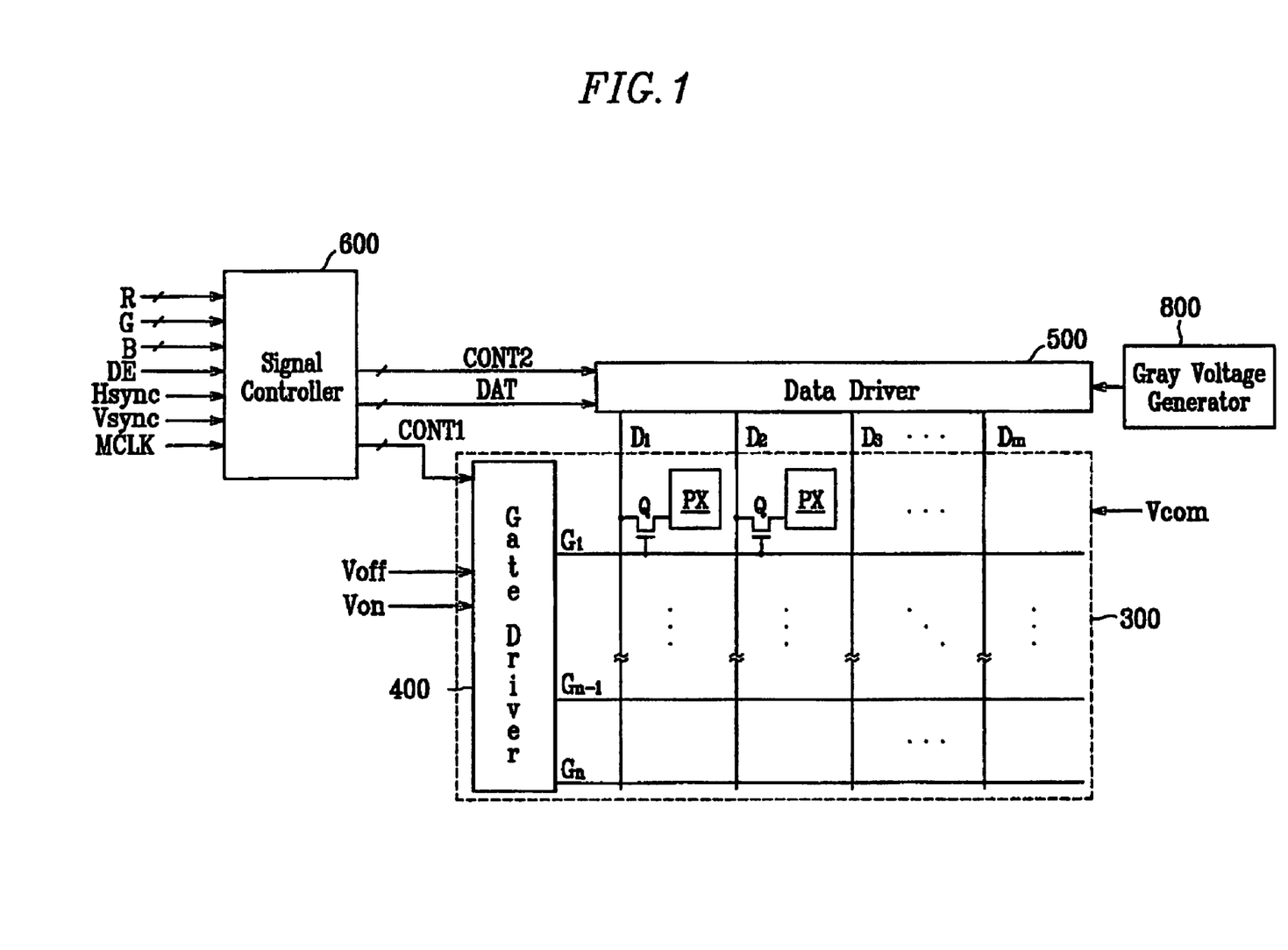
FIG. 1 is a block diagram of an LCD according to an embodiment of the present invention.
Figure 2:
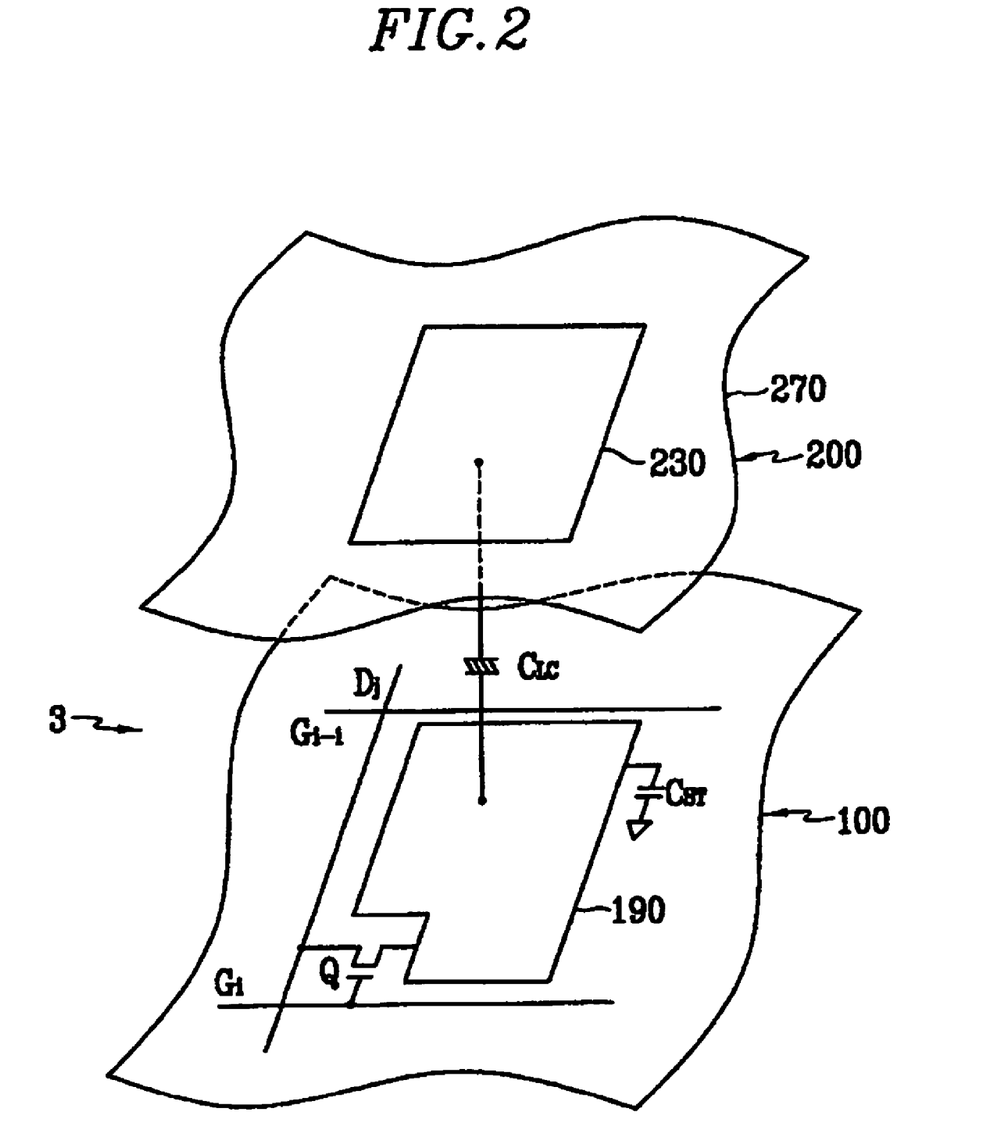
FIG. 2 is an equivalent circuit diagram of a pixel of an LCD according to an embodiment of the present invention.

FIG. 1 is a block diagram of an LCD according to an embodiment of the present invention, and FIG. 2 is an equivalent circuit diagram of a pixel of an LCD according to an embodiment of the present invention.

Referring to FIG. 1, an LCD includes an LC panel assembly 300, a gate driver 400, and a data driver 500 that are connected to the panel assembly 300. A gray voltage generator 800 is connected to the data driver 500. A signal controller 600 controls the above elements.

The panel assembly 300 includes a plurality of display signal lines $G_1$-$G_n$ and $D_1$-$D_m$, and a plurality of pixels PX connected thereto and arranged substantially in a matrix. In a structural view shown in FIG. 2, the panel assembly 300 includes lower and upper panels 100 and 200 with an LC layer 3 interposed therebetween.

The display signal lines $G_1$-$G_n$ and $D_1$-$D_m$ are disposed on the lower panel 100 and include a plurality of gate lines $G_1$-$G_n$ which transmit gate signals (also referred to as "scanning signals"), and a plurality of data lines $D_1$-$D_m$ which transmit data signals. The gate lines $G_1$-$G_n$ extend substantially in a row direction and are substantially parallel to each other, while the data lines $D_1$-$D_m$ extend substantially in a column direction and are substantially parallel to each other.

Each pixel includes: a switching element Q connected to one of the gate lines $G_1$-$G_n$ and one of the data lines $D_1$-$D_m$; and an LC capacitor $C_{LC}$ and storage capacitor $C_{ST}$ each connected to the switching element Q. Optionally, the storage capacitor $C_{ST}$ may be omitted.

The switching element Q includes a TFT and is provided on the lower panel 100. Switching element Q has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 190 provided on the lower panel 100 and a common electrode 270 provided on the upper panel 200, as two terminals. The LC layer 3 is disposed between the two electrodes 190 and 270 and functions as a dielectric of the LC capacitor $C_{LC}$. The pixel electrode 190 is connected to the switching element Q. The common electrode 270 is supplied with a common voltage Vcom and covers an entire surface of the upper panel 200. Alternatively, the common electrode 270 may be provided on the lower panel 100, and both electrodes 190 and 270 may be in the shape of bars or stripes.

The storage capacitor $C_{ST}$ is an auxiliary capacitor for the LC capacitor $C_{LC}$. The storage capacitor $C_{ST}$ includes the pixel electrode 190 and a separate signal line, which is provided on the lower panel 100 and overlaps the pixel electrode 190 with an insulator. Storage capacitor $C_{ST}$ is supplied with a predetermined voltage such as the common voltage Vcom. Alternatively, the storage capacitor $C_{ST}$ includes the pixel electrode 190 and an adjacent gate line ("a previous gate line"), which overlaps the pixel electrode 190 with an insulator.

For color displays, each pixel uniquely represents one of three primary colors (i.e., spatial division) or represents three primary colors in turn (i.e., time division) such that a spatial or temporal sum of the three primary colors is recognized as a desired color. FIG. 2 shows an example of the spatial division in which each pixel is provided with a color filter 230 (one of red, green, and blue color filters), in an area of the upper panel 200 facing the pixel electrode 190. Alternatively, the color filter 230 is provided on or under the pixel electrode 190 on the lower panel 100.

One or more polarizers (not shown) are attached to the panels 100 and 200.

Referring to FIG. 1 again, the gray voltage generator 800 generates two sets of gray voltages related to the transmittance of the pixels. The gray voltages in one set have a positive polarity with respect to the common voltage Vcom, while those in the other set have a negative polarity with respect to the common voltage Vcom.

The gate driver 400 is connected to the gate lines $G_1$-$G_n$ of the panel assembly 300, and synthesizes the gate-on voltage Von and the gate-off voltage Voff from an external device to generate gate signals for application to the gate lines $G_1$-$G_n$.

The data driver 500 is connected to the data lines $D_1$-$D_m$ of the panel assembly 300 and applies data voltages, which are selected from the gray voltages supplied from the gray voltage generator 800, to the data lines $D_1$-$D_m$.

The signal controller 600 controls the gate driver 400 and the data driver 500, and may be mounted on a printed circuit board (PCB).

A detailed example of the LCD shown in FIGS. 1 and 2 is now described with reference to FIG. 3.

Figure 3:
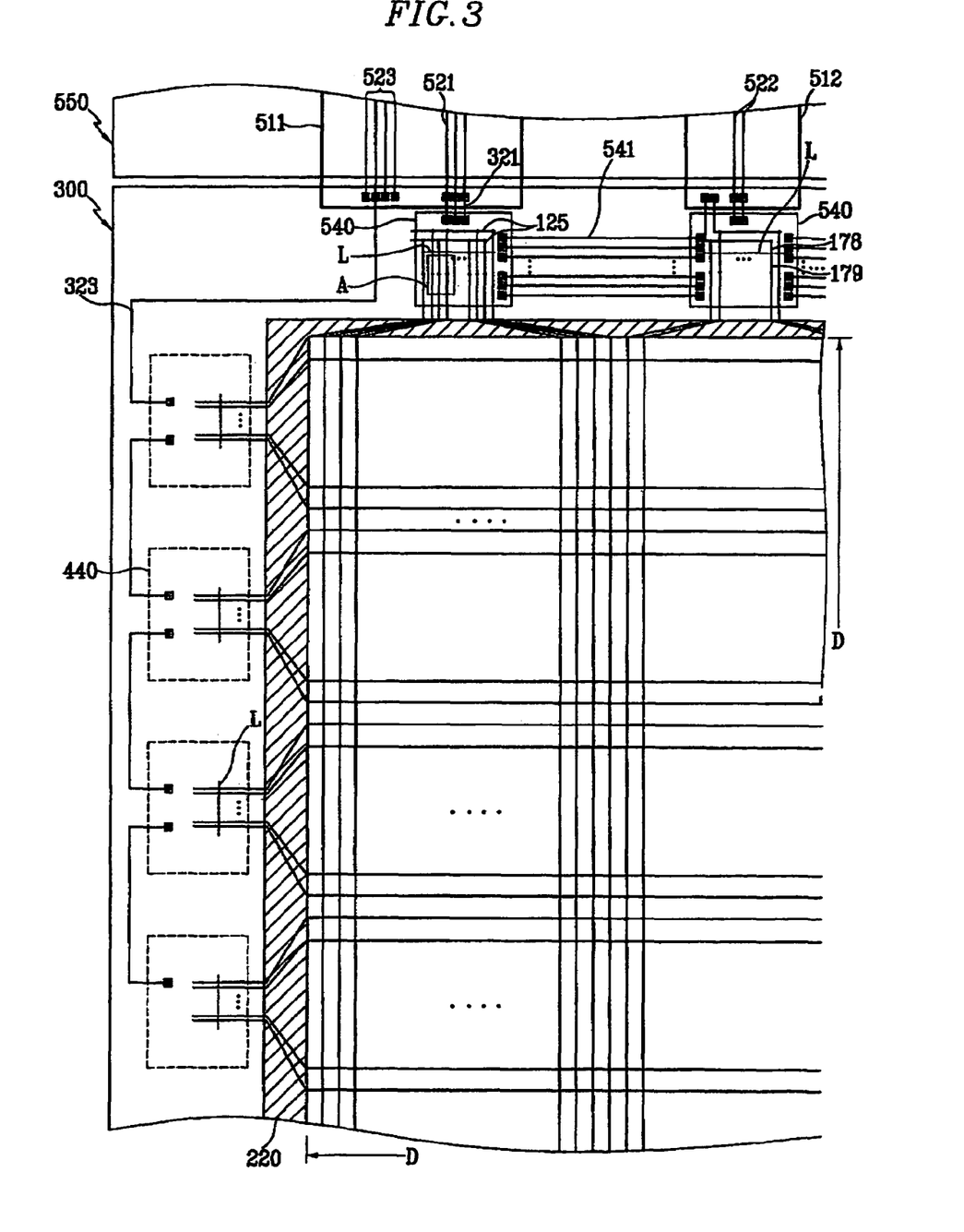
FIG. 3 is a schematic layout view of an LCD according to an embodiment of the present invention.

FIG. 3 is a schematic layout view of an LCD according to an embodiment of the present invention.

As shown in FIG. 3, a panel assembly 300 includes a plurality of gate lines ($G_1$-$G_n$) and a plurality of data lines ($D_1$-$D_m$). A plurality of gate driving IC chips 440 and a plurality of data driving IC chips 540 are mounted on the panel assembly 300. The gate driving IC chips 440 are disposed near a left edge of the panel assembly 300, and the data driving IC chips 540 are disposed near a top edge of the panel assembly 300. A PCB 550 is disposed near a top edge of the panel assembly 300 and several circuit elements such as signal controller 600 and gray voltage generator 800 are provided thereon. The panel assembly 300 and the PCB 550 are electrically and physically interconnected by a plurality of FPC films 511 and 512.

The leftmost FPC film 511 includes a plurality of data transmission lines 521 and a plurality of driving signal lines 523. The data transmission lines 521 transmit image data and are connected to input terminals of the data driving IC chips 540. The driving signal lines 523 transmit electrical voltages and control signals for activating the driving IC chips 540 and 440 via driving signal lines 321 and 323 disposed on the panel assembly 300.

The remaining FPC film 512 includes a plurality of driving signal lines 522 for transmitting electrical voltages and control signals to the data driving IC chips 540 electrically connected thereto.

The signal lines 521-523 are connected to circuit elements on the PCB 550 and receive signals therefrom.

Alternatively, the driving signal lines 523 may be provided on a separate FPC film (not shown).

As shown in FIG. 3, a plurality of pixel areas defined by the intersections of the gate lines extending in a transverse direction and the data lines extending in a longitudinal direction form a display area D on the panel assembly 300. A light blocking member 220 (indicated by a hatched area) for blocking light leakage exterior to the display area D is disposed around the display area D.

As also shown in FIG. 3, the gate lines as well as the data lines are substantially parallel within the display area D. They are grouped into fan-like shapes in a "fan-out" area as they leave the display area D. The lines are again substantially parallel after crossing blocking member 220.

The data driving IC chips 540 are disposed outside of the display area D and are sequentially arranged in the transverse direction. Adjacent data driving IC chips 540 are connected by a plurality of interconnections 541. Image data transmitted from the leftmost FPC film 511 to the leftmost data driving IC 540 is transmitted to the next data driving IC 540 via the interconnections 541, and so on.

A plurality of inspection lines 125 are formed on the panel assembly 300. Two inspection lines 125 are disposed under each of the data driving IC chips 540. Each of the inspection lines 125 extends substantially in the transverse direction, curves upward, and includes an inspection pad. The number of inspection lines 125 may be varied. As shown in FIG. 3, the data lines are alternately connected to the inspection lines 125. Specifically, one of two inspection lines 125 is connected to the odd-numbered data lines ($D_1$, $D_3$, etc.,) and the other of two inspection lines 125 is connected to the even-numbered data lines ($D_2$, $D_4$, etc.)

The gate driving IC chips 440 are mounted near the left edges of the panel assembly 300 external to the display area D and are arranged in the longitudinal direction. The driving signal lines 323 are located near the gate driving IC chips 440 and electrically connect the driving signal lines 523 of the leftmost FPC film 511 to the uppermost gate driving IC 440 or electrically connect the gate driving IC chips 440. The gate driving IC chips 440 may be formed exclusively on the lower assembly 100 with switching elements Q or driving signal lines 323, such that the lower assembly 100 includes a plurality of thin film transistors and a plurality of signal lines (not shown in FIG. 3).

The reference numeral "L" in FIG. 3 represents a cutting line irradiated by a laser to electrically disconnect individual gate lines 121 and data lines 171 from each other in a final step of a manufacturing process.

As described above, the LC panel assembly 300 includes panels 100 and 200. One of panels 100 and 200 provided with TFTs is referred to herein as a "TFT array panel."

An exemplary TFT array panel for an LCD according to an embodiment of the present invention is now described in detail with reference to FIGS. 4-7.

Figure 4:
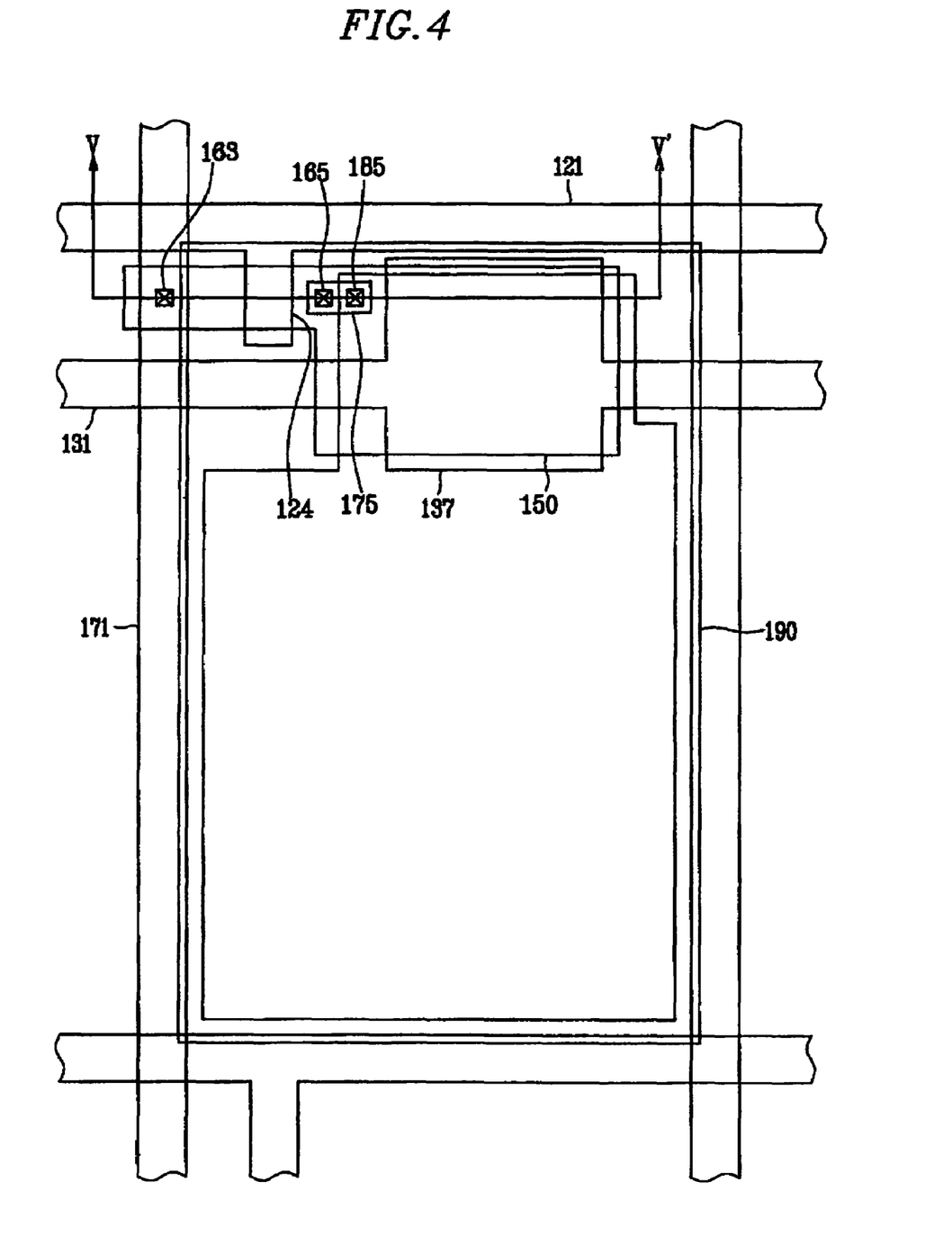
FIG. 4 is an exemplary layout view of a display area of a TFT array panel shown in FIGS. 1-3.
Figure 5:
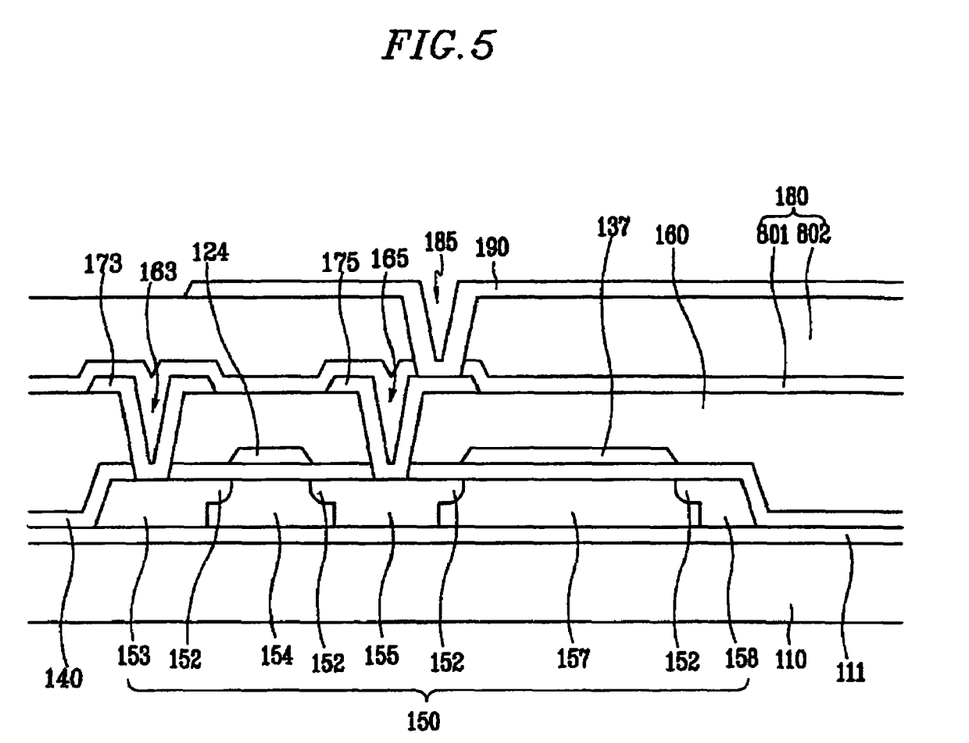
FIG. 5 is a sectional view of the display area shown in FIG. 4 taken along the lines V-V'.
Figure 6:
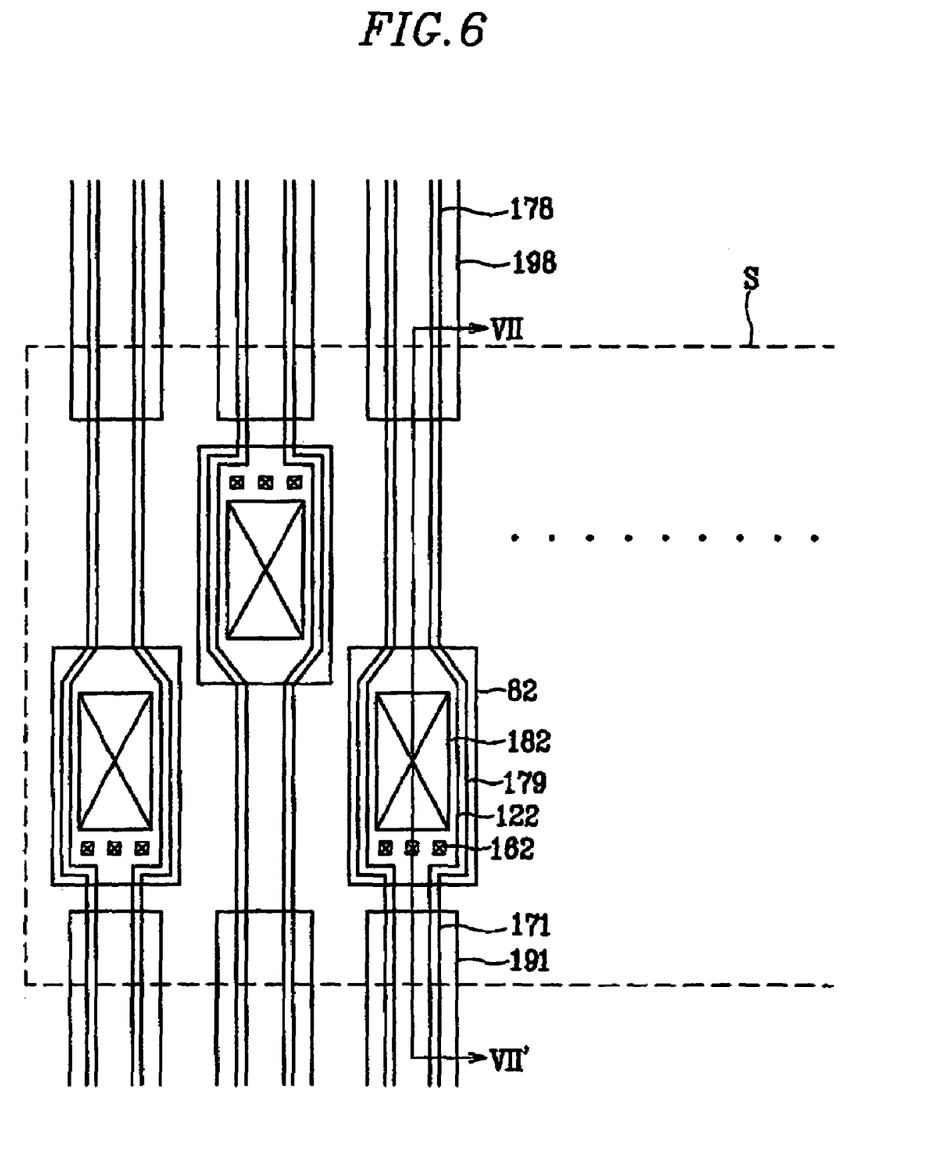
FIG. 6 is an expanded layout view of a region A including a contact area connecting data lines and a data driving IC of the TFT array panel shown in FIGS. 1-3 near a data driver.
Figure 7:
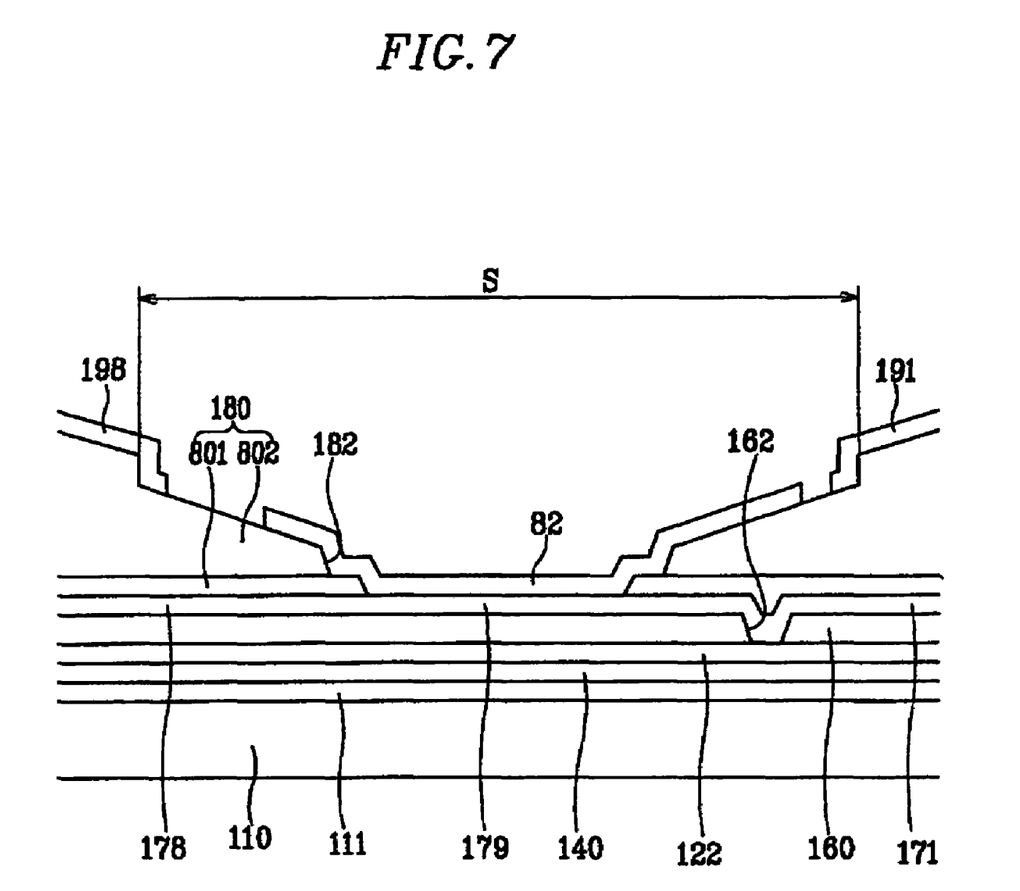
FIG. 7 is a sectional view of the peripheral area shown in FIG. 6 taken along the lines VII-VII'.

FIG. 4 is an exemplary layout view of a display area of the TFT array panel shown in FIGS. 1-3. FIG. 5 is a sectional view of the display area shown in FIG. 4 taken along the lines V-V'. FIG. 6 is an expanded layout view of a region A including a contact area connecting data lines and a data driving IC of the TFT array panel shown in FIGS. 1-3 near a data driver. FIG. 7 is sectional view of the peripheral area shown in FIG. 6 taken along the lines VI-VI'.

A blocking film 111 preferably made of silicon oxide ($SiO_2$) or silicon nitride (SiNx) is formed on a transparent insulating substrate 110. The blocking film 111 may have a dual-layered structure.

A plurality of semiconductor islands 150 preferably made of polysilicon are formed on the blocking film 111. Each of the semiconductor islands 150 includes: a plurality of extrinsic regions containing conductive impurities. The extrinsic regions include a plurality of heavily doped regions and a plurality of lightly doped regions. Semiconductor islands 150 further include a plurality of intrinsic regions containing few conductive impurities. The intrinsic regions include a channel region 154 and a storage region 157. The heavily doped regions include source and drain regions 153 and 155 separated from each other by the channel region 154 and dummy region 158. The lightly doped regions 152 are narrow and are disposed between the intrinsic regions 154 and 157 and the heavily doped regions 153, 155, and 158. The lightly doped regions 152 disposed between the source region 153 and the channel region 154, and between the drain region 155 and the channel region 154, are referred to as "lightly doped drain regions" (LDD).

A gate insulating layer 140 preferably made of SiNx is formed on the semiconductor islands 150 and the blocking film 111.

A plurality of gate conductors including a plurality of gate lines 121, a plurality of storage electrode lines 131, and a plurality of auxiliary signal lines 122 (referring to FIGS. 6 and 7) are formed on an insulating substrate 110.

The gate lines 121 for transmitting gate signals extend substantially in a transverse direction and include a plurality of gate electrodes 124 protruding downward to overlap the channel areas 154 of the semiconductor islands 151. The gate electrodes 124 may further overlap the lightly doped regions 152. Each gate line 121 may include an expanded end portion having a large area for contacting another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage, and include a plurality of storage electrodes 137 protruding upward and downward and overlapping the storage regions 157 of the semiconductor islands 150.

Each of the auxiliary signal lines 122 extends substantially in the longitudinal direction and has a portion having a large area.

The gate conductors 121, 131, and 122 are preferably made of a low resistivity material including a metal containing aluminum (Al) or an aluminum alloy. The gate conductors 121, 131, and 122 may have a multi-layered structure including two films having different physical characteristics. One of the two films is preferably made of a low resistivity metal including a metal containing Al for reducing signal delay or voltage drop in the gate conductors 121, 131, and 122. The other film is preferably made of a material such as chromium (Cr), molybdenum (Mo), a Mo alloy, tantalum (Ta), or titanium (Ti), which has preferable physical, chemical, and electrical contact characteristics with other materials such as indium tin oxide (ITO) or indium zinc oxide (IZO).

In addition, the lateral sides of the gate conductors 121, 131, and 122 are inclined relative to a surface of the substrate 110 with an inclination angle in the range of about 30-90 degrees.

An interlayer insulating layer 160 is formed on the gate conductors 121, 131, and 122. The interlayer insulating layer 160 is preferably made of a photosensitive organic material having a preferable flatness characteristic, a low dielectric insulating material such as a-Si:C:O and a-Si:O:F formed by plasma enhanced chemical vapor deposition (PECVD), or an inorganic material such as SiNx and $SiO_2$.

The interlayer insulating layer 160 has a plurality of contact holes 162 exposing the portions of the auxiliary signal lines 122, respectively. In addition, the interlayer insulating layer 160 and the gate insulating layer 140 have a plurality of contact holes 163 and 165 exposing the source regions 153 and the drain electrodes 175, respectively.

A plurality of data conductors including a plurality of data lines 171, a plurality of drain electrodes 175, and a plurality of data connection lines 178 are formed on the interlayer insulating layer 160.

The data lines 171 for transmitting data voltages extend substantially in the longitudinal direction and intersect the gate lines 121. Each data line 171 includes a plurality of source electrodes 173 connected to the source regions 153 through the contact holes 163, and an expansion 179. The expansions 179 of the data lines 171 extend to the region A outside of the display area D to contact to the output terminals of the data driving IC 540 and are connected to the auxiliary signal lines 122 through the contact holes 162. The auxiliary signal lines 122 overlap expansions 179 of the data lines 171 creating a contact area along with the expansions 179.

The drain electrodes 175 are separated from the source electrodes 173 and connected to the drain regions 155 through the contact holes 165.

The data connection lines 178 extend substantially in the longitudinal direction and are connected to the expansions 179 of the data lines 171 to connect to the data lines 171 to the inspection lines 125 (referring to FIG. 3).

The data conductors 171, 175, and 178 are preferably made of a refractory metal including Cr, Mo, Ti, Ta, or alloys thereof. They may have a multi-layered structure preferably including a low resistivity film and a film providing preferable contact characteristics. For example, the multi-layered structure may include a Mo lower film, an Al middle film, and a Mo upper film as well as the above-described combinations of a Cr lower film and an aluminum-neodymium (Al—Nd) upper film, and an Al lower film and a Mo upper film. As another example, the multi-layered structure may include a Cr lower film and a molybdenum-tungsten (MoW) upper film.

Like the gate conductors 121, 131, and 122, the data conductors 171 and 175 have tapered lateral sides relative to a surface of the substrate 110, with an inclination angle in the range of about 30-80 degrees.

A passivation layer 180 is formed on the data conductors 171, 175, and 178, and the interlayer insulating layer 160. The passivation layer 180 is also preferably made of a photosensitive organic material having a preferable flatness characteristic, a low dielectric insulating material such as a-Si:C:O and a-Si:O:F formed by PECVD, or an inorganic material such as $SiN_x$ and $SiO_2$. The passivation layer 180 includes a first insulating layer 801 made of an inorganic material and a second insulating layer 802 formed on the first insulating layer 801 and made of an organic material. The passivation layer 180 has a plurality of contact holes 185 exposing the drain electrodes 175, and a plurality of contact holes 182 exposing the end portions of the data lines 171. The contact holes 182 exposing the end portions of the data lines 171 and the contact holes 162 exposing the auxiliary signal lines 122 do not overlap each other, and the passivation layer 180 completely covers the contact holes 162.

As shown in FIG. 7, the portion of the passivation layer 180 defining the contact holes 182 has tapered lateral sides relative to a surface of the substrate 110, and the inclination angles thereof are about 45 degrees. The reference numeral S identifies the location of the tapered lateral sides of the passivation layer 180.

In comparison to layers having steep lateral slopes, the thin and gradually tapered lateral sides of the passivation layer 180 of the above-described embodiment prevent conductive particles from remaining at the lateral side of the passivation layer 180 adjacent to the contact hole 182 during a manufacturing process. Also, when connecting the driving chips 540 to the contact area, the thin and gradually tapered lateral sides can improve contact of the driving chips 540, thereby improving reliability of the contact area.

A plurality of pixel electrodes 190, a plurality of contact assistants 82, and a plurality of assistant lines 191 and 198 are formed on the passivation layer 180 or the interlayer insulating layer 160. The assistant lines 191 and 198 are preferably made of at least one transparent conductor such as ITO or IZO and an opaque reflective conductor (in an LCD providing a reflective mode or translucent mode) such as Al or Ag.

The pixel electrodes 190 are located in the display area D, and are physically and electrically connected to the drain electrodes 175 through the contact holes 185 such that the pixel electrodes 190 receive the data voltages from the drain regions 155 via the drain electrodes 175.

Referring again to FIG. 2, pixel electrodes 190 supplied with the data voltages generate electric fields in cooperation with the common electrode 270 on the upper panel 200. The electric fields determine orientations of liquid crystal molecules in an LC layer 3 disposed therebetween or cause currents in light emitting members (not shown) disposed therebetween.

As described above, pixel electrode 190 and common electrode 270 form liquid crystal capacitor $C_{LC}$. Pixel electrode 190, drain region 155 connected thereto, and storage electrode line 131 including storage electrodes 137 form a storage capacitor $C_{ST}$.

The pixel electrodes 190 may overlap the gate lines 121 and the data lines 171 to increase an aperture ratio, particularly when the passivation layer 180 is made of a low dielectric insulator.

The contact assistants 82 are disposed on the contact holes 182 to be connected to the expansions 179 of the data lines 171, and are located outside display area D. The contact assistants 82 substantially cover the expansions 179 of the data lines 171. Alternatively, the contact assistants 82 may be disposed only near the contact holes 182.

Contact assistants 82 protect the exposed portions of data lines 171 to prevent corrosion and improve connections between data lines 171 and IC chips 540. The above-described contact structures can be applied to the gate lines 121 and the gate driver 400 as well.

The assistant lines 191 and 198 respectively overlap the data lines 171 and data connection lines 178, respectively, outside display area D, and extend to the inside of the tapered portion S. It is preferable that the assistant lines 191 and 198 completely cover the data lines 171 and data connection lines 178, respectively. In an LCD providing a translucent mode, the assistant lines 191 and 198 may include an opaque reflective conductor and a transparent conductor on the same layer as the pixel electrode 190. In an embodiment of the present invention, the compete overlap of the assistant lines 191 and 198 with the signal lines 171 and 178 prevents etchants used on ITO or IZO from penetrating into the passivation layer 180 or patterning the pixel electrode 190. The overlap further prevents the tapered portion of the organic layer 802 adjacent to the contact holes 182 from separating, thereby inhibiting the corrosion and disconnection of the signal lines 171 and 178 in the contact area and improving reliability of the contact area. Contact area reliability can be further improved in embodiments where assistant lines 191 and 198 include a double-layered structure.

The above-described structure of the contact areas can be applied to the gate lines 121 and the gate driver 400 as well.

Now, the operation of the above-described LCD will be described in detail.

The signal controller 600 is supplied with input image signals R, G, and B and input control signals for controlling the display of the image signals. The input control signals include, for example, a vertical synchronization signal Vsync, a horizontal synchronization signal Hsync, a main clock MCLK, and a data enable signal DE, from an external graphics controller (not shown). The signal controller 600 generates gate control signals CONT1 and data control signals CONT2, and processes the image signals R, G, and B to be suitable for the operation of the panel assembly 300 in response to the input control signals and the input image signals R, G, and B. The signal controller 600 transmits the gate control signals CONT1 to the gate driver 400, and the processed image signals DAT and the data control signals CONT2 to the data driver 500 through the signal lines 521-523 and the driving signal lines 321 and 323.

The gate control signals CONT1 include a scanning start signal STV for instructing the gate driver 400 to start scanning, at least one clock signal for controlling the output time of the gate-on voltage Von, and an output enable signal OE for defining the duration of the gate-on voltage Von.

The data control signals CONT2 include a horizontal synchronization start signal STH for informing the data driver 500 of the start of a horizontal period, a load signal LOAD for instructing the data driver 500 to apply the data voltages to the data lines $D_1$-$D_m$, an inversion control signal RVS for reversing the polarity of the data voltages (with respect to the common voltage Vcom), and a data clock signal HCLK.

The data driver 500 receives a packet of the image data R, G, and B for a pixel row from the signal controller 600 and converts the image data R, G, and B into analog data voltages selected from the gray voltages supplied from the gray voltage generator 800 in response to the data control signals CONT2 from the signal controller 600. Thereafter, the data driver 500 applies the data voltages to the data lines D1-Dm.

In response to the gate control signals CONT1 from the signal controller 600, the gate driver 400 applies the gate-on voltage Von to the gate lines $G_{1-Gn}$ thereby turning on the switching elements Q connected thereto. The data voltages applied to the data lines $D_1$-$D_m$ are supplied to the pixels through the activated switching elements Q.

The difference between the data voltage and the common voltage Vcom is represented as a voltage across the LC capacitor $C_{LC}$ (i.e., a pixel voltage). The orientations of the LC molecules in the LC capacitor $C_{LC}$ depend on the magnitude of the pixel voltage. The molecular orientations determine the polarization of light passing through the LC layer 3. The polarizer(s) convert the light polarization into light transmittance.

By repeating this procedure each horizontal period (equal to one period of the horizontal synchronization signal Hsync and the data enable signal DE), all gate lines $G_1$-$G_n$ are sequentially supplied with the gate-on voltage Von during a frame, thereby applying the data voltages to all pixels. The inversion control signal RVS applied to the data driver 500 is controlled such that the polarity of the data voltages is reversed for each frame (which is called "frame inversion"). The inversion control signal RVS may also be controlled such that the polarity of the data voltages flowing in a data line in one frame are reversed (for example, line inversion and dot inversion), or the polarity of the data voltages in one packet are reversed (for example, column inversion and dot inversion).

This process will now be described in more detail.

After receiving the scanning start signal STV, the uppermost gate driving IC 440 selects the gate-on voltage Von from the two voltages Von and Voff and provides the selected voltage Von to the first gate lines $G_1$. The remaining gate lines $G_2$-$G_n$ are supplied with the gate-off voltage Voff. The switching elements Q connected to the first gate line $G_1$ are turned on upon the application of the gate-on voltage Von, and the data voltages for the first pixel row are applied to the LC capacitors $C_{LC}$ and the storage capacitors $C_{ST}$ in the first pixel row through the activated switching elements Q. After charging the capacitors $C_{LC}$ and $C_{ST}$ of the first pixel row, the uppermost gate driving IC 440 applies the gate-off voltage Voff to the first gate line $G_1$ to turn off the switching elements Q connected thereto, and applies the gate-on voltage Von to the second gate line $G_2$.

By repeating this procedure, the uppermost gate driving IC 440 applies the gate-on voltage Von to all the gate lines connected thereto, and outputs a carry signal to the next gate driving IC 440, indicating that the first gate driving IC 440 has scanned all gate lines connected thereto.

The second gate driving IC 440, after receiving the carry signal, scans all the gate lines connected thereto and generates a carry signal to be transmitted to the next gate driving IC 440 upon completion of the scanning.

In this way, the scanning of the remaining gate drive IC chips is completed. After the lowermost gate driving IC 440 has finished scanning, one frame will have been scanned.

Although embodiments of the present invention have been described with regard to LCDs, it will be appreciated that the above descriptions may also be adapted to other flat panel display devices, including but not limited to OLEDs.

In accordance with various embodiments of the present invention, the addition of auxiliary signal lines of low resistivity to contact areas where signal lines are connected to driving ICs can prevent signal delay. Contact holes connecting conductive layers in the contact areas of a multi-layered structure can be configured such that the contact holes do not overlap with each other. In addition, assistant lines can completely cover the signal lines. As a result, separation of an organic layer in the contact areas, and corrosion and disconnection of the signal lines may be reduced. Accordingly, the reliability of the contact areas may be increased, the contact resistance of the contact areas may be minimized, and performance of the LCD may be improved.

Although preferred embodiments of the present invention have been described herein, it should be understood that the invention is not limited to the disclosed embodiments. Other variations and/or modifications are contemplated by the present disclosure and fall within the spirit and scope of the present invention. Accordingly, the scope of the invention is to be defined only by the appended claims.

What is claimed is:

1. A thin film transistor array panel, comprising:
    a plurality of gate lines;
    a plurality of data lines intersecting the gate lines;
    a plurality of switching elements connected to the gate lines and the data lines;
    a plurality of pixel electrodes connected to the switching elements;
    an interlayer insulating layer formed between the gate lines and the data lines;
    a passivation layer covering the gate lines, the data lines, and the switching elements, the passivation layer having a plurality of first contact holes exposing portions of the data lines, wherein the switching elements and the pixel electrodes are connected through the first contact holes;
    a plurality of contact assistants formed on the passivation layer and connected to the data lines through a plurality of second contact holes in the passivation layer; and
    a plurality of assistant lines formed on the passivation layer and disposed outside a display area, wherein the assistant lines completely cover the data lines adjacent to the contact assistants without contact portions.

2. The display panel of claim 1, wherein portions of the passivation layer defining the second contact holes have tapered lateral sides.

3. The display panel of claim 2, wherein the assistant lines cover the tapered lateral sides of the passivation layer.

4. The panel of claim 3, wherein the assistant lines comprise:

a transparent conductor made of a transparent material; and a reflective conductor made of a conductive material.

5. The panel of claim 4, wherein the passivation layer comprises:

a first insulating layer made of an organic material; and a second insulating layer made of an inorganic material.

6. The panel of claim 1, further comprising a plurality of auxiliary lines connected to the data lines through a plurality of third contact holes in the interlayer insulating layer.

7. The panel of claim 6, wherein the third contact holes do not overlap the second contact holes and are completely covered by the passivation layer.

8. The panel of claim 7, wherein the auxiliary lines are on the same layer as the gate lines, and are connected to the data lines.

9. The panel of claim 6, wherein the auxiliary lines comprise a metal containing aluminum (Al).

10. A thin film transistor array panel, comprising:

a plurality of data lines;

a passivation layer covering the data lines;

a plurality of contact assistants formed on the passivation layer and connected to the data lines through a plurality of contact holes in the passivation layer; and a plurality of assistant lines formed on the passivation layer and disposed outside a display area, wherein the assistant lines completely cover the data lines adjacent to the contact assistants without contact portions.

11. The panel of claim 10, further comprising:

an interlayer insulating layer; and a plurality of auxiliary lines connected to the data lines through a plurality of second contact holes in the interlayer insulating layer, wherein the second contact holes do not overlap the first contact holes and are completely covered by the passivation layer.

12. The panel of claim 10, further comprising:

a plurality of switching elements connected to the data lines; and a plurality of pixel electrodes connected to the switching elements.

* * * * *